(12) United States Patent
Finders

(10) Patent No.: US 9,811,002 B2
(45) Date of Patent: Nov. 7, 2017

(54) DETERMINATION AND APPLICATION OF NON-MONOTONIC DOSE SENSITIVITY

(71) Applicant: ASML Netherlands B.V., Veldhoven (NL)

(72) Inventor: Jozef Maria Finders, Veldhoven (NL)

(73) Assignee: ASML NETHERLANDS B.V., Veldhoven (NL)

( * ) Notice: Subject to any disclaimer, the term of this patent is extended or adjusted under 35 U.S.C. 154(b) by 38 days.

(21) Appl. No.: 14/904,395

(22) PCT Filed: Jul. 1, 2014

(86) PCT No.: PCT/EP2014/063912
§ 371 (c)(1),
(2) Date: Jan. 11, 2016

(87) PCT Pub. No.: WO2015/007511
PCT Pub. Date: Jan. 22, 2015

(65) Prior Publication Data
US 2016/0179016 A1    Jun. 23, 2016

Related U.S. Application Data

(60) Provisional application No. 61/856,350, filed on Jul. 19, 2013.

(51) Int. Cl.
*G03B 27/32* (2006.01)
*G03C 5/00* (2006.01)
*G03F 7/20* (2006.01)

(52) U.S. Cl.
CPC .......... *G03F 7/70558* (2013.01); *G03F 7/705* (2013.01); *G03F 7/70625* (2013.01)

(58) Field of Classification Search
CPC .. G03F 7/705; G03F 7/70558; G03F 7/70625; G03F 7/70666; G03F 7/70675
(Continued)

(56) References Cited

U.S. PATENT DOCUMENTS

2005/0168716 A1    8/2005    Ausschnitt
2008/0295061 A1    11/2008   Eisenmann et al.
(Continued)

FOREIGN PATENT DOCUMENTS

EP    0 729 072    8/1996

OTHER PUBLICATIONS

International Search Report and Written Opinion dated Oct. 7, 2014 in corresponding International Patent Application No. PCT/EP2014/063912.

(Continued)

*Primary Examiner* — Colin Kreutzer
(74) *Attorney, Agent, or Firm* — Pillsbury Winthrop Shaw Pittman LLP

(57) ABSTRACT

A method of lithography in a lithographic apparatus configured to transfer a pattern from a patterning device onto a substrate, the method including: determining a dose sensitivity of at least part of the pattern at a plurality of values of a dose, wherein the dose sensitivity is not a monotonically increasing or monotonically decreasing function of the dose. A computer product including a processor, a memory and a storage device, wherein the storage device at least stores values of, or a function describing, a dose sensitivity of at least part of a lithographic pattern at a plurality of values of dose, wherein the dose sensitivity is not a monotonically increasing or monotonically decreasing function of the dose.

20 Claims, 11 Drawing Sheets

(58) Field of Classification Search
USPC .............................................. 355/77; 430/30
See application file for complete search history.

(56) References Cited

U.S. PATENT DOCUMENTS

2010/0099035 A1  4/2010  Sandström et al.
2011/0249244 A1  10/2011  Leewis et al.

OTHER PUBLICATIONS

Alexander Starikov, "Exposure Monitor Structure," SPIE, vol. 1261, Integrated Circuit Metrology, Inspection, and Process Control IV, pp. 315-324 (1990).

DETERMINATION AND APPLICATION OF NON-MONOTONIC DOSE SENSITIVITY

CROSS-REFERENCE TO RELATED APPLICATIONS

This application is the U.S. national phase entry of PCT patent application no. PCT/EP2014/063912, which was filed on Jul. 1, 2014, which claims the benefit of priority of U.S. provisional application No. 61/856,350, which was filed on Jul. 19, 2013, and which is incorporated herein in its entirety by reference.

FIELD

The present disclosure relates to a lithographic apparatus and a device manufacturing method.

BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g. comprising part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include so-called steppers, in which each target portion is irradiated by exposing an entire pattern onto the target portion at one time, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

SUMMARY

A dose in the process of transferring a pattern from a patterning device onto a substrate may mean an amount of radiation energy within a range of wavelengths an area on the substrate receives in an amount of time. Dose sensitivity may characterize dependence of a parameter of the pattern transferred onto the substrate on the dose. For example, the parameter may be a physical parameter (e.g., critical dimension (CD), image log slope (ILS)) of a resist image (i.e. a pattern transferred to a resist layer on the substrate, after development or etching). The parameter may be a parameter (e.g., CD, ILS) of an optical image projected via the patterning device onto a surface of the substrate (i.e., aerial image). In one example, the dose sensitivity may be a derivative of the parameter as a function of the dose. In one example, the dose sensitivity is the dependence of a critical dimension on the dose. Critical dimension can be defined as the smallest width of a line or hole or the smallest space between two lines or two holes.

According to an embodiment, there is described herein a method for lithography using a lithographic apparatus configured to transfer a pattern from a patterning device onto a substrate, the method comprising: determining values of, or a function describing, dose sensitivity of at least part of the pattern at a plurality of dose values, wherein the dose sensitivity is not a monotonically increasing or monotonically decreasing function of the dose.

According to an embodiment, the values of, or the function describing, dose sensitivity of at least part of the pattern at a plurality of values of dose are determined by a metrology technique.

According to an embodiment, the dose sensitivity is a derivative of a parameter of a feature in a resist image of the pattern on the substrate with respect to dose.

According to an embodiment, the dose sensitivity is a derivative of a parameter of a feature in an aerial image of the pattern with respect to dose. According to an embodiment, the dose sensitivity is a derivative of a parameter of a feature in an aerial image of the pattern as function of threshold in the aerial image.

According to an embodiment, the dose is a function of a position on a resist image of the pattern on the substrate.

According to an embodiment, the parameter is a critical dimension measured at a predetermined depth in a resist layer on the substrate.

According to an embodiment, the dose sensitivity is a derivative of a sidewall angle of a feature in a resist image of the pattern on the substrate as a function of dose.

According to an embodiment, the method further comprises calculating a dimension of a feature in a resist image of the pattern on the substrate using the dose sensitivity.

According to an embodiment, calculating the dimension of the feature comprising calculating the dimension using one or more parameters selected from: a parameter of a radiation source of the lithographic apparatus, a parameter of projection optics of the lithographic apparatus, a parameter of an illumination source of the lithographic apparatus, a resist parameter, a development parameter, and/or an etching parameter.

According to an embodiment, the method further comprises optimizing or adjusting a design variable, wherein the dose sensitivity is a function of the design variable.

According to an embodiment, the design variable is selected from a group consisting of moving standard deviation in the z direction (MSDz), a coherence setting, post-exposure bake temperature, post-exposure bake time, resist formulation, a controllable element in projection optics, shape and location of a pattern on the patterning device, bias of a pattern on the patterning device, a parameter of a developer, and a combination thereof.

According to an embodiment, there is described herein a non-transitory computer program product comprising a computer readable medium having instructions recorded thereon, the instructions when executed by a computer implementing a method as described herein.

According to an embodiment, there is described herein a computer product comprising a processor, a memory and a storage device, wherein the storage device at least stores values of, or a function describing, a dose sensitivity of at least part of a lithographic pattern at a plurality of values of dose, wherein the dose sensitivity is not a monotonically increasing or monotonically decreasing function of the dose.

According to an embodiment, the computer product is configured to calculate a dimension of a feature in a resist image of the lithographic pattern using the values of, or the function, describing the dose sensitivity.

According to an embodiment, the computer product is configured to calculate a cost function that is a function of one or more design variables, the one or more design variables including dose.

According to an embodiment, the computer product is configured to simulate an aerial image or a resist image using the values of, or the function describing, the dose sensitivity.

BRIEF DESCRIPTION OF THE DRAWINGS

Embodiments of the disclosure will now be described, by way of example only, with reference to the accompanying schematic drawings in which corresponding reference symbols indicate corresponding parts, and in which.

DETAILED DESCRIPTION

Figure 1:
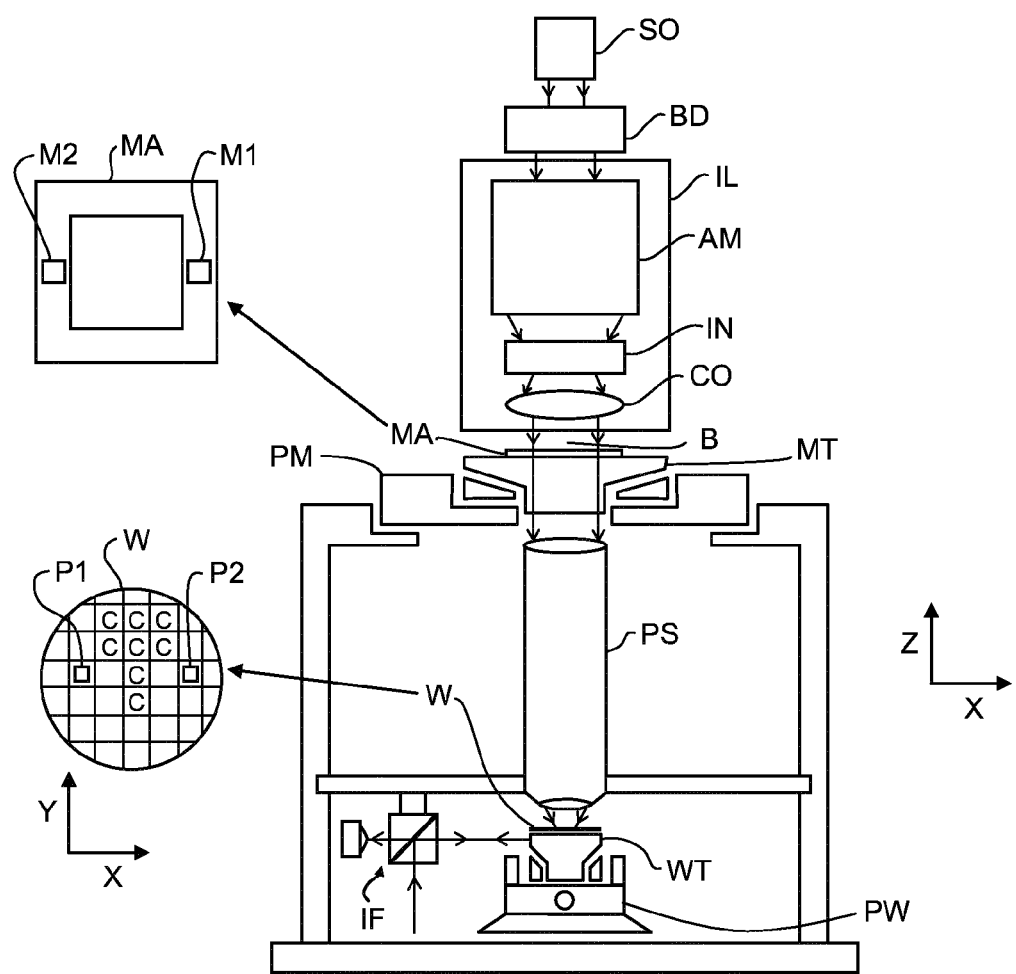
FIG. 1 schematically depicts a lithographic apparatus according to an embodiment of the disclosure.

FIG. 1 schematically depicts a lithographic apparatus according to one embodiment of the disclosure. The apparatus comprises:
- an illumination system (illuminator) IL configured to condition a radiation beam B (e.g. UV radiation or DUV radiation);
- a support structure (e.g. a mask table) MT constructed to hold a patterning device (e.g. a mask) MA and connected to a first positioner PM configured to accurately position the patterning device in accordance with certain parameters;
- a substrate table (e.g. a wafer table) WT constructed to hold a substrate (e.g. a resist-coated wafer) W and connected to a second positioner PW configured to accurately position the substrate in accordance with certain parameters; and
- a projection system (e.g. a refractive projection lens system) PS configured to project a pattern imparted to the radiation beam B by patterning device MA onto a target portion C (e.g. comprising one or more dies) of the substrate W.

The illumination system may include various types of optical components, such as refractive, reflective, magnetic, electromagnetic, electrostatic or other types of optical components, or any combination thereof, for directing, shaping, or controlling radiation.

The support structure holds the patterning device in a manner that depends on the orientation of the patterning device, the design of the lithographic apparatus, and other conditions, such as for example whether or not the patterning device is held in a vacuum environment. The support structure can use mechanical, vacuum, electrostatic or other clamping techniques to hold the patterning device. The support structure may be a frame or a table, for example, which may be fixed or movable as required. The support structure may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g. employing a transmissive mask). Alternatively, the apparatus may be of a reflective type (e.g. employing a programmable mirror array of a type as referred to above, or employing a reflective mask).

The lithographic apparatus may be of a type having two (dual stage) or more substrate tables (and/or two or more support structures). In such "multiple stage" machines the additional tables/support structure may be used in parallel, or preparatory steps may be carried out on one or more tables/support structure while one or more other tables/support structures are being used for exposure.

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD comprising, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may comprise an adjuster AD configured to adjust the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may comprise various other components, such as an integrator IN and a condenser CO. The illuminator may be used to condition the radiation beam, to have a desired uniformity and intensity distribution in its cross-section.

The radiation beam B is incident on the patterning device (e.g., mask) MA, which is held on the support structure (e.g., mask table) MT, and is patterned by the patterning device. Having traversed the patterning device MA, the radiation beam B passes through the projection system PS, which focuses the beam onto a target portion C of the substrate W. With the aid of the second positioner PW and position sensor IF (e.g. an interferometric device, linear encoder or capacitive sensor), the substrate table WT can be moved accurately, e.g. so as to position different target portions C in the path of the radiation beam B. Similarly, the first positioner PM and another position sensor (which is not explicitly depicted in FIG. 1) can be used to accurately position the patterning device MA with respect to the path of the radiation beam B, e.g. after mechanical retrieval from a mask library, or during a scan. In general, movement of the support structure MT may be realized with the aid of a long-stroke module (coarse positioning) and a short-stroke module (fine positioning), which form part of the first positioner PM. Similarly, movement of the substrate table WT may be realized using a long-stroke module and a short-stroke module, which form part of the second positioner PW. In the case of a stepper (as opposed to a scanner) the support structure MT may be connected to a short-stroke actuator only, or may be fixed. Patterning device MA and substrate W may be aligned using patterning device alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the patterning device MA, the patterning device alignment marks may be located between the dies.

The depicted apparatus could be used in at least one of the following modes:

1. In step mode, the support structure MT and the substrate table WT are kept essentially stationary, while an entire pattern imparted to the radiation beam is projected onto a target portion C at one time (i.e. a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the support structure MT and the substrate table WT are scanned synchronously while a pattern imparted to the radiation beam is projected onto a target portion C (i.e. a single dynamic exposure). The velocity and direction of the substrate table WT relative to the support structure MT may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

3. In another mode, the support structure MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Figure 2:
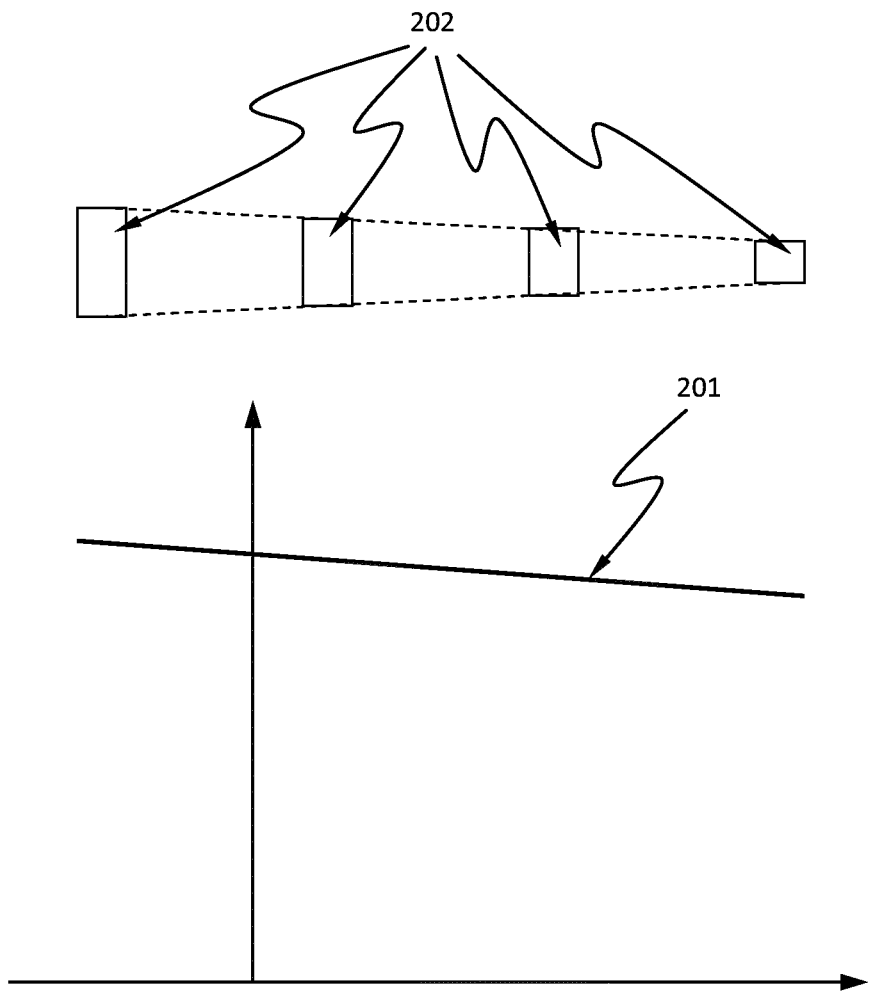
FIG. 2 schematically depicts a nearly linear dependence of a CD on the dose.

Critical dimension (CD) of at least part of a lithographic pattern usually has a nearly linear dependence on the dose, at least within a range relevant to the lithographic process (e.g., within ±10% or within ±20% from the nominal dose). FIG. 2 includes a schematic graph showing a nearly straight line 201 illustrating this nearly linear dependence. The vertical axis is the CD and the horizontal axis is the dose. While FIG. 2 shows that the CD may vary with dose, in some cases, the CD may be essentially constant. FIG. 2 also depicts an exemplary feature 202 of the pattern in a resist image transferred under different doses, showing how the critical dimension of the feature 202 changes with dose in the example depicted in the graph of FIG. 2 (feature 202 is not actual size and the size differences in the feature 202 are exaggerated to show the variation in CD; the top of the feature 202 in the resist corresponds to the left hand edge of the feature 202, the bottom of the feature 202 in the resist corresponds to the right hand edge of the feature 202, and the lateral extent of the feature 202 in the resist corresponds to the bottom and top edges of the feature 202).

Figure 3:
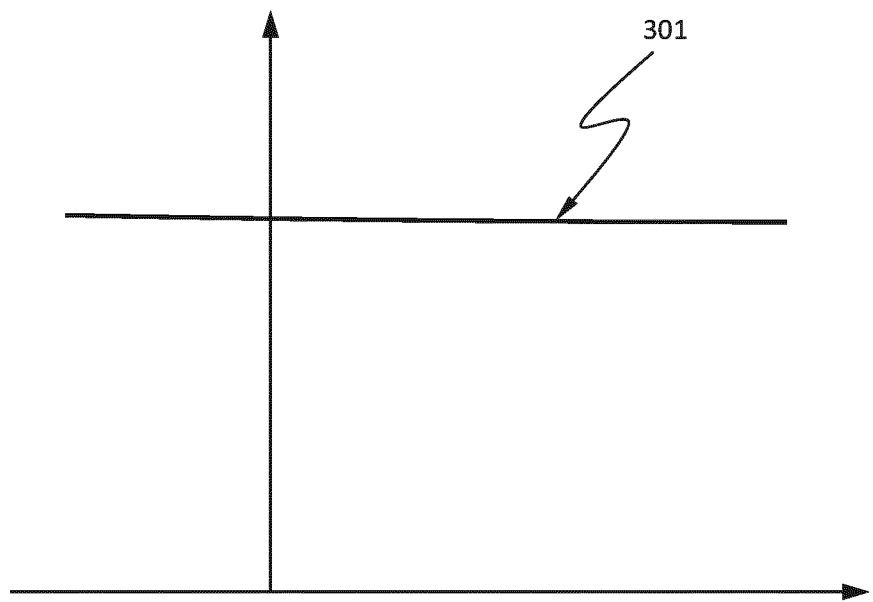
FIG. 3 is a schematic showing that the dose sensitivity is nearly constant at different doses.

FIG. 3 is a schematic graph showing that the dose sensitivity 301 is nearly constant at different doses (perhaps having a slight monotone increase or decrease of sensitivity versus dose). The vertical axis is the dose sensitivity and the horizontal axis is the dose. Thus, in design and operation of the lithographic process, the dose sensitivity could be treated as constant across a working range (e.g., 10%) from nominal dose. While image contrast changes through intensity, this effect is weak, and leads to small variations of the dose sensitivity though dose.

However, it has been unexpectedly discovered that the dose sensitivity is not necessarily constant with respect to the dose nor does the dose sensitivity necessarily monotonically increase or decrease versus dose. In various situations, the dose sensitivity may not be constant across a range of doses. Dose sensitivity may have relatively large variations within the range of doses relevant to the lithographic process, using extreme ultraviolet (EUV) or deep ultraviolet (DUV) radiation. Additionally or alternatively, the dose sensitivity may be non-monotonic with respect to dose. Variations of dose sensitivity of greater than or equal to 25%, greater than or equal to 30%, greater than or equal to 40%, or greater than or equal to 50% through a 10%-15% dose range may occur. The dose sensitivity of CD may strongly depend on the dose applied, which leads to consideration of local dose sensitivity.

Figure 4:
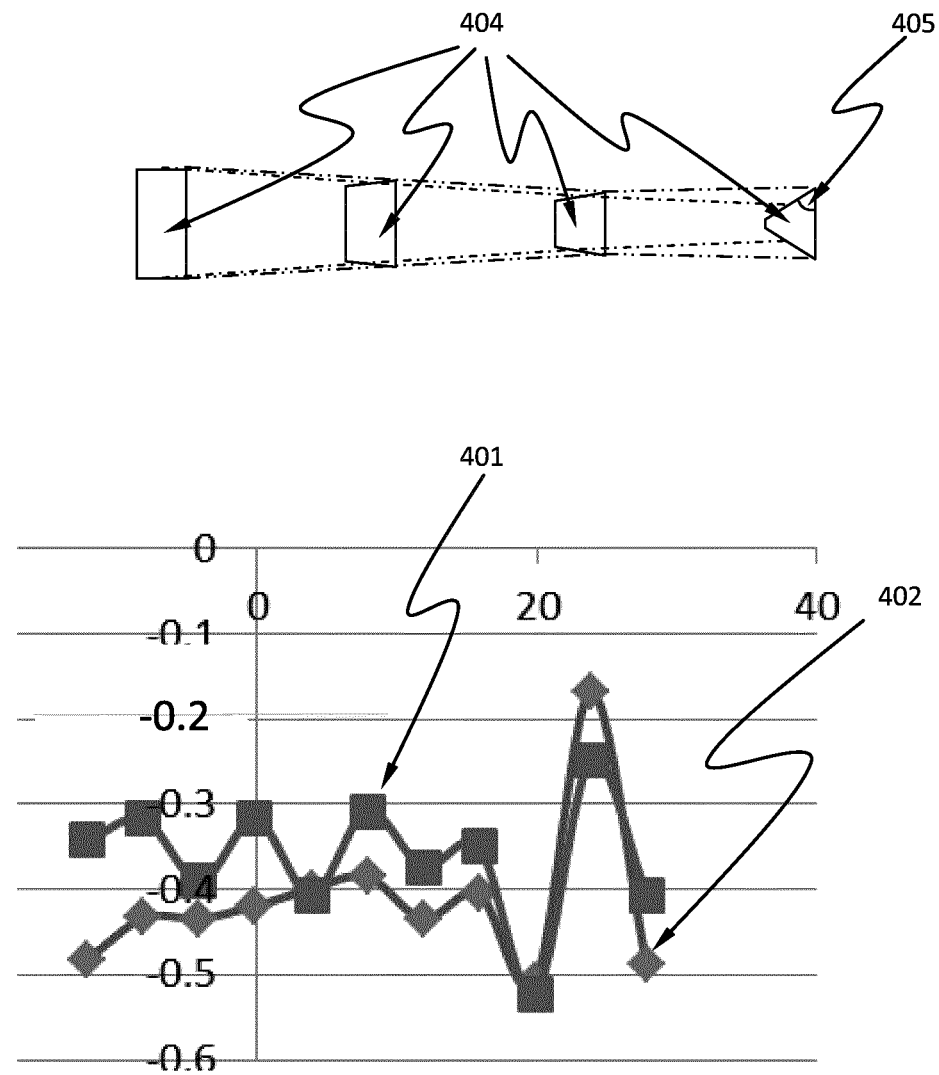
FIG. 4 shows three exemplary dose sensitivities as functions of the dose.

FIG. 4 includes graphs of two exemplary dose sensitivities 401 and 402 as functions of the dose. The vertical axis is the dose sensitivity in the unit of nm/mJ/cm$^2$ and the horizontal axis is the dose in percentage change from a nominal dose. The two dose sensitivities 401 and 402 respectively characterize the dependence of CDs measured at the middle and the bottom of a feature 404 in the resist image, on the dose. The size and cross-sectional shape of the feature 404 may change with the dose. In particular, underexposure (doses lower than the nominal dose) may tend to cause footing, i.e., widening of the feature at or near its bottom. Overexposure (doses higher than the nominal dose) may tend to cause resist loss. Exposure at the nominal dose may have a SWA variance, driven by absorption and diffusion in the resist.

FIG. 4 depicts an exemplary feature 404 of the pattern in a resist image transferred under different doses, showing how the feature 404 changes with dose (feature 404 is not actual size and the changes in the feature 404 are exaggerated to show the variation over dose; the top of the feature 404 in the resist corresponds to the left hand edge of the feature 404, the bottom of the feature 404 in the resist corresponds to the right hand edge of the feature 404, and the lateral extent of the feature 404 in the resist corresponds to the bottom and top edges of the feature 404). The dose sensitivity can also characterize the dependence of the sidewall angle (SWA) 405 of the feature 404 on the dose.

As can be seen in FIG. 4, the two dose sensitivities 401 and 402 have large variations and are non-monotonic. Indeed, the dose sensitivity curves have various excursions, particularly at high dose (overexposure). For example, the curves appear to exhibit oscillations through various dose ranges. Moreover, the dose sensitivities at a particular dose vary with respect to depth of the feature in the resist. The dose sensitivity for the bottom, middle and top part of a resist profile are different. Thus, the particular part of the resist, and its dose sensitivity, should be identified for the particular application (e.g., whether the top, middle or bottom should be better formed). This can be identified by studying the pattern transfer through etch.

Figure 5:
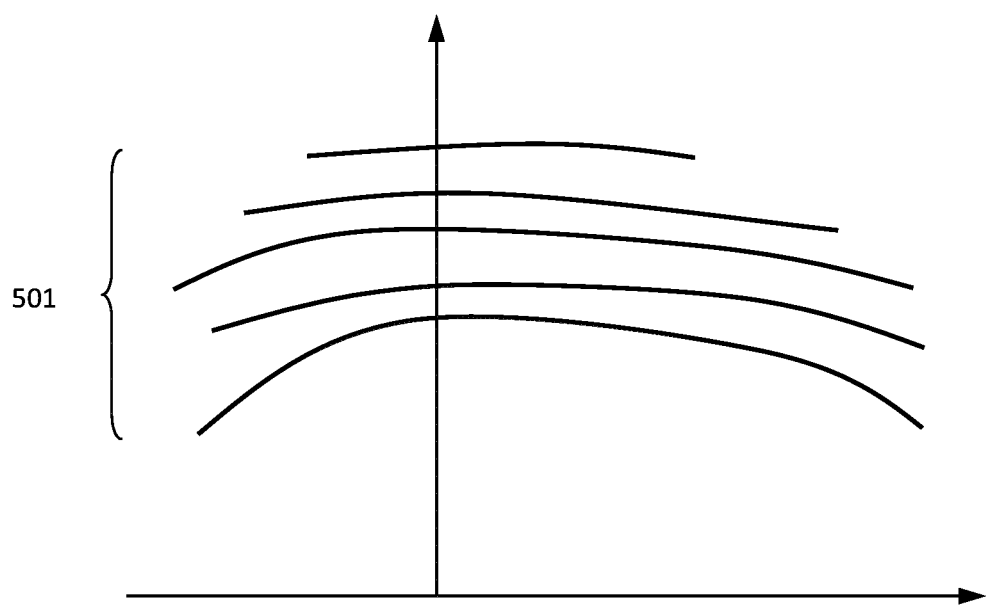
FIG. 5 shows Bossung curves for a pattern of 40 nm dense lines and spacing transferred on to a substrate under various doses.

FIG. 5 shows Bossung curves 501 for a pattern of 40 nm dense lines and spacing transferred on to a substrate under various doses. A Bossung curve graph maps CD (vertical axis) as a function of focus (horizontal axis) under various doses (each Bossung curve represents a different dose). The non-uniform spacing between the Bossung curves confirms that dose sensitivities are not constant with respect to the dose.

Figure 6:
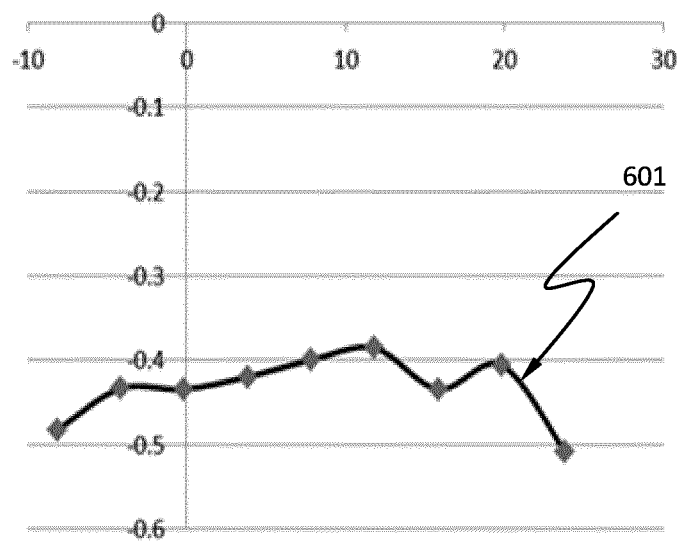
FIG. 6 shows dose sensitivity as a function of dose for the pattern of 40 nm dense lines and spacing transferred on to a substrate.

FIG. 6 shows dose sensitivity as a function 601 of dose for a pattern of 40 nm dense lines and spacing transferred on to a substrate. The vertical axis is the dose sensitivity in the unit of nm/mJ/cm$^2$ and the horizontal axis is the dose in percentage change from a nominal dose. Function 601 is non-constant and non-monotonic.

Figure 7:
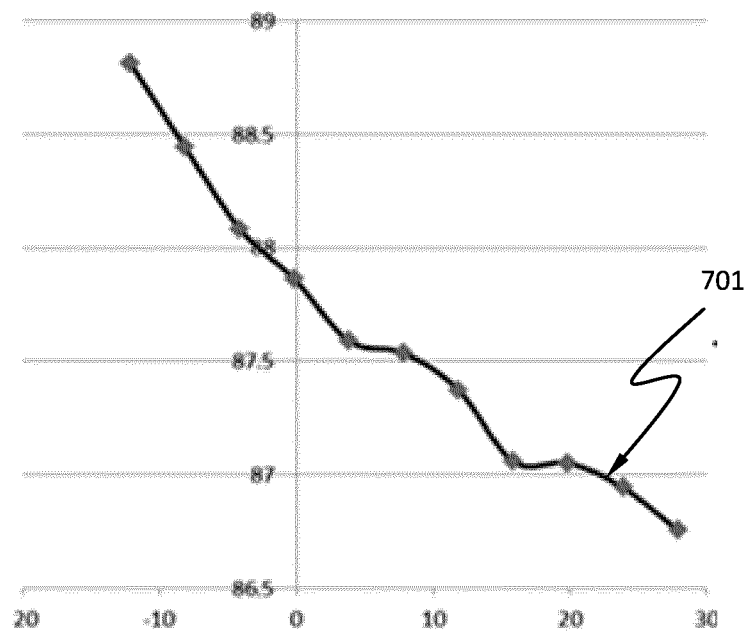
FIG. 7 shows SWA as a function of dose for the pattern of 40 nm dense lines and spacing transferred on to a substrate.

FIG. 7 shows SWA as a function 701 of dose for a pattern of 40 nm dense lines and spacing transferred on to a substrate. The vertical axis is the SWA in the unit of degree and the horizontal axis is the dose in percentage change from a nominal dose. The non-monotonic dependence of the dose sensitivity on the dose, and the difference between the dependence of the dose sensitivity on dose at different locations on a feature (e.g., dose sensitivities 401 and 402), can be attributed to the dependence of the SWA on the dose. In one example, the SWA can change by more than or equal to 1 degrees, more than or equal to 2 degrees, more than or equal to 3 degrees, more than or equal to 4 degrees or more than or equal to 5 degrees within ±10%-15% from the nominal dose.

Figure 8:
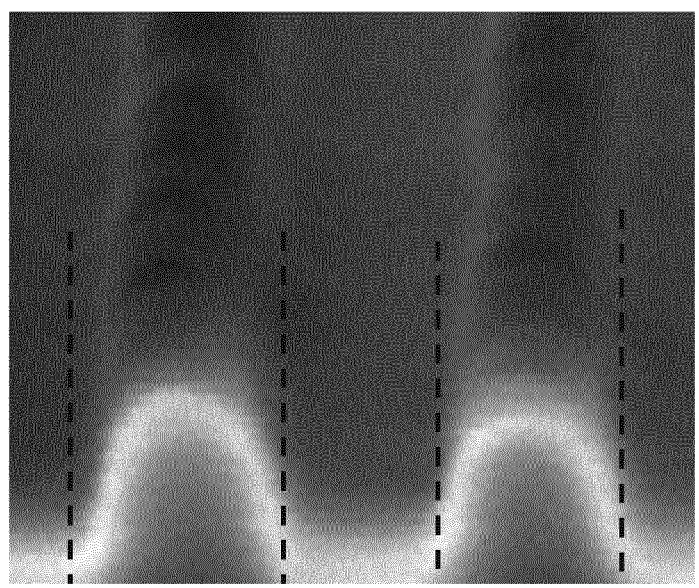
FIG. 8 shows a cross-sectional view of the pattern of 40 nm dense lines and spacing transferred on to a substrate under a dose of 17 mJ/cm$^2$.
Figure 9:
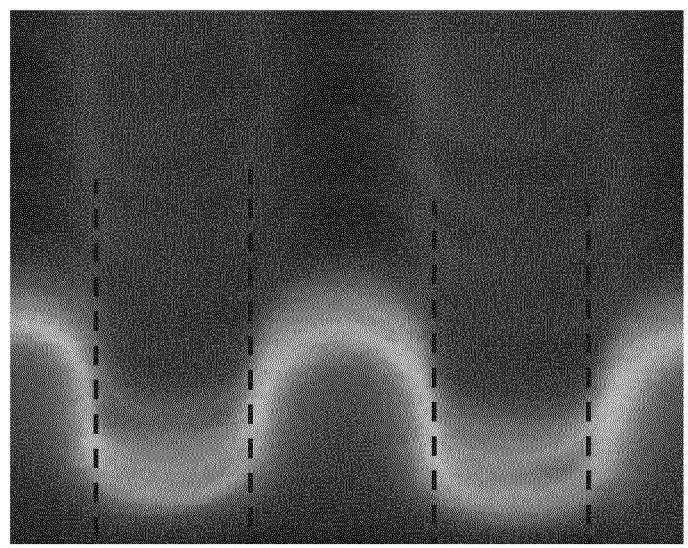
FIG. 9 shows a cross-sectional view of the pattern of 40 nm dense lines and spacing transferred on to a substrate under a dose of 14 mJ/cm$^2$.

FIG. 8 shows a cross-sectional view of a pattern of 40 nm dense lines and spacing transferred on to a substrate at a dose of 17 mJ/cm$^2$. FIG. 9 shows a cross-sectional view of the pattern of 40 nm dense lines and spacing transferred on to a substrate at a dose of 14 mJ/cm$^2$. The SWAs under these conditions are clearly different.

SWA may not only depend on the dose. SWA, thus the dose sensitivity, may also depend on many other parameters such as the geometric details of the features on the patterning device, one or more parameters of the illumination, one or more parameters of the projection optics, and/or one or more parameters of any post-exposure processing (e.g., baking temperature and/or duration, etching, etc.).

The SWA change through dose may be different for different pitches associated with the pattern. For example, for 40 nm lines at different pitch, there may be 3 or more degrees difference. So, for a resist height of 70 nm, this result may in approximately 3.6 nm difference in CD between the features at pitch (dependent on where the metrology measures the CD on the resist profile).

Figure 10:
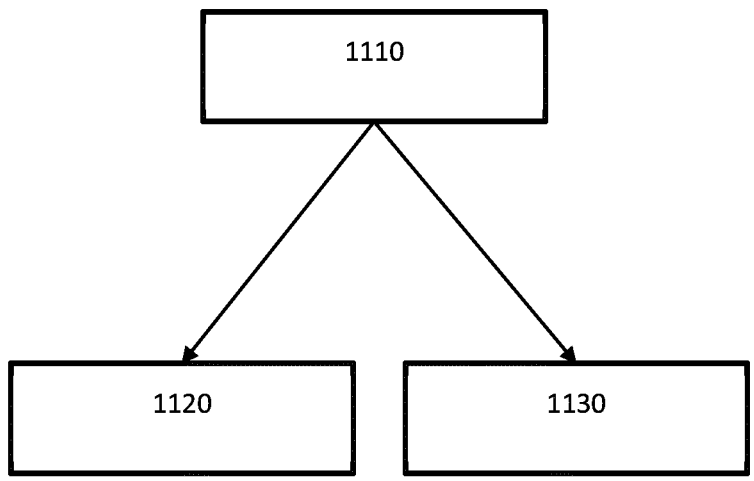
FIG. 10 shows a flow chart for a method of using the dose sensitivity.

FIG. 10 shows a flow chart for a method of using the dose sensitivity. In step 1110, values of, or a function describing, dose sensitivity for at least part of a lithographic pattern at a plurality of values of dose is determined, wherein the dose sensitivity is not a monotonically increasing or monotonically decreasing function of the dose. In step 1120, a dimension of a feature of the pattern in a resist image or aerial image is calculated using the dose sensitivity. In step 1130, one or more design variables of the lithographic process or the lithographic apparatus are optimized or adjusted, wherein the dose sensitivity is a function of the one or more design variables. In one example, the one or more design variables include dose. To determine the local dose sensitivity, a metrology technique should be used that is able to measure the relevant metrics (e.g., CD, SWA, resist height) to be able to arrive at the dose sensitivity versus dose, or the SWA versus dose. In an embodiment, the metrology technique may involve a scanning electron microscope (SEM) or a scatterometer metrology tool. In an embodiment, the metrology tool is located in the lithographic apparatus and may be electronically connected to the controller of the lithographic apparatus (and/or to the controller of a radiation source and/or a substrate processing apparatus). The results of such measurements should be fed back, or fed forward, into the process to determine if the optimum working point is being achieved or else to make corrections.

The optimization and adjustment may include fine-tuning steps applied to the lithographic apparatus and/or design layout. These include, for example, but not limited to, optimization or tuning of one or more numerical aperture (NA) and/or optical coherence settings, optimization or tuning of one or more substrate processing parameters (e.g., post-exposure bake temperature, etching rate, etc.), optimization or tuning of a parameter of the projection optics of the lithographic apparatus, a customized illumination scheme, use of a phase shifting patterning device, optical proximity correction (OPC) in the design layout, or other methods generally defined as "resolution enhancement techniques" (RET). The term "projection optics" as used herein should be broadly interpreted as encompassing various types of optical systems, including, for example, refractive optics, reflective optics, and catadioptric optics. The term "projection optics" may include components operating according to any of these design types for directing, shaping or controlling the projection beam of radiation, collectively or singularly. The term "projection optics" may include any optical component in the lithographic projection apparatus, no matter where the optical component is located on an optical path of the lithographic projection apparatus. Projection optics may include optical components for shaping, adjusting and/or projecting radiation from the radiation source before the radiation passes the patterning device, and/or optical components for shaping, adjusting and/or projecting the radiation after the radiation passes the patterning device. The projection optics generally exclude the radiation source and the patterning device.

In addition, or alternatively, to optimization of a design layout or a patterning device (e.g., OPC), the illumination source can also be optimized or adjusted in an effort to improve the overall lithography fidelity. In an embodiment, the illumination source is optimized or adjusted jointly with patterning device optimization or adjustment (which is often referred to as "source mask optimization"). As used herein, the illumination source refers to the one or more characteristics of illumination at a particular optical plane in the system, wherein the one or more characteristics may include, e.g., angular radiation distribution, coherence, etc. Illumination sources may include annular or multi-pole (e.g., dipole or quadrupole) illumination with various coherence settings. Off-axis illumination sources, such as annular or multi-pole (e.g., dipole or quadrupole) illumination, can provide more freedom for OPC design, thereby improving the imaging results.

Accordingly, the local dose sensitivity may be used in a simulator (software and/or hardware) to describe and find an optimum and/or turned working point in optical lithography. This simulator may be used for, but not limited to, the optical proximity correction and/or source mask optimization described above. In an embodiment, the simulator may use an optical model and/or a resist model to simulate the projection, and exposure on a substrate, of the pattern. In an embodiment, a resist model is used in the simulator to describe the local dose sensitivity. In an embodiment, a full resist model may be used describing all the relevant effects (e.g., footing, SWA, resist loss). Such a resist model may make simulations slow. Accordingly, an optical model describing the optical column or a simple resist model (e.g., comprising a diffusion term to describe acid diffusion) is desirably used but it may not properly account for the dose sensitivity versus dose. Accordingly, in an embodiment, an empirical model that describes the relevant parameters (e.g., SWA, resist-loss) through dose may be used that is calibrated by a measurement technique that can measure those parameters. For the model, the sidewall may be measured through pitch by a metrology technique (e.g., scatterometry) and a model is fitted from this data. In an embodiment, the local dose sensitivity can be incorporated into the simulator by using an aerial image model multiplied by a correction factor for the local dose sensitivity. This kind of model may be appropriate for relatively simple structures (e.g., 1 dimensional structures or simple 2 dimensional structures, such as contact holes); this may not work for multiple features or complex geometries.

The term "design variables" as used herein comprises a set of parameters of a lithographic apparatus, for example, parameters a user of the lithographic apparatus can adjust. It should be appreciated that any characteristics of a lithographic process, including those of the radiation source, the illumination source, the patterning device, the projection optics, post-exposure processes and/or resist characteristics can be among the design variables in the optimization. Optimization may include minimizing a cost function that is a function of the one or more design variables. Any suitable algorithm may be used for optimization.

Further, as part of the optimization and/or tuning, the one or more parameters of the resist profile (CD, SWA, footing, resist loss) that have an impact on the final performance/yield should be identified and be optimized and/or tuned. For example, a small footing of the resist profile could influence the local dose sensitivity significantly, but may not have impact on final yield/performance if the footing is removed during, for example, etch. Accordingly, the calculations accounting for local dose sensitivity may ignore or underweight the footing. On the other hand, if the footing is unaltered and is transferred into the next layer, this may have a significant impact on performance/yield. In that case, the optimization may be focused on the footing and/or the footing may be heavily weighted. These one or more parameters would be measured in the processing steps (e.g., exposure, development, etch) using an appropriate metrology technique.

One design variable may be adjustment of the bias of the design layout. The bias is the difference between a pattern or feature in the design layout and the pattern or feature intended to print on the substrate. For example, a circular pattern of 25 nm diameter may be printed on the substrate by a 50 nm diameter pattern in the design layout or by a 20 nm diameter pattern in the design layout but with high dose. In an embodiment, the particular bias of the pattern or feature applied is inversely proportional to the applicable dose sensitivity.

Another design variable may be adjustment of a process parameter of the exposed substrate. For example, post-exposure bake temperature and/or time may be tuned since such parameters may influence diffusion in the resist. As an example, in the case of trenches, the ratio of dose sensitivity between the waist of the trench and the end of the trench may be considered as a parameter in relation to the post-exposure bake temperature. This ratio may show a maximum at a certain dose. The dose position of this maximum may be shifted by changing the post-exposure bake temperature. But, if the dose set point has a relatively large ratio of dose sensitivities of the two features, it may be difficult to control the aspect ratio of the trench. However, if the dose set point has a relatively low ratio of dose sensitivities of the two features, it possible to well maintain the aspect ratio (shape) of the trench.

Another design variable may be adjustment of the nature of the resist and/or the nature of the developer to develop the resist. For example, there may be a choice between positive tone developer or resist and negative tone developer or resist. For both tones, there may be dependency of SWA through dose. For example, negative tone developer may be able to yield a smaller critical dimension of feature than positive tone developer at a same dose sensitivity. However, negative tone developer may have a reentrant profile (i.e., a sidewall angle greater than 90 degrees compared to an entrant profile where the sidewall angle is less than 90 degrees) and may have SWA changing through dose. Accordingly, those considerations should be factored and so the computational lithography should be able to simulate SWA and dose sensitivity versus dose and consider their impact with other parameters in arriving at the choice of resist/developer.

Another design variable may be control of the location of the focus in the lithographic apparatus. For example, if the lithographic apparatus has a relatively large value (e.g., 25 or greater) of moving standard deviation in the z direction (MSDz) (e.g., vibrations of the substrate table in the z direction, e.g., the vertical direction), there is a relatively strong blur of the aerial image through resist height and the local dose sensitivity may be substantially constant through dose. For small MSDz (e.g., less than 25), the local dose sensitivity may significantly change through dose. Thus, there may be stringent demand on one or more other parameters such as post-exposure bake temperature. Consequently, improving the optical contrast (e.g., through small MSDz) may only give a benefit if one or more other parameters can be used to tune the local dose sensitivity or those one or more other parameters can be well controlled (i.e., the process control is quite stable). If this is not the case, it may be beneficial to increase the MSDz and smear out the aerial image over the resist height. Dose sensitivity may be higher but may be easier to control and/or substantially constant through dose. Thus, injection of an MSDz might be beneficial to make the SWA/local dose sensitivity more robust against disturbances in one or more other parameters (e.g., post-exposure bake).

A further way to account for dose sensitivity variation is to change the resist profile context in order to change the working point in the optical lithography. For example, the coherence setting of a scanner may be changed to account for scanner to scanner differences in the resist profile with the aim of having uniform resist profiles resulting from the use of the various scanners. Similarly, the post-exposure bake temperature of a bake plate may be changed to account for bake plate to bake plate differences in the resist profile with the aim of having uniform resist profiles resulting from the use of the various bake plates.

A further way to account for the dose sensitivity variation versus dose is to provide a resist with low local dose sensitivity. For example, the resist formulation may be changed such that the profile changes significantly through dose.

A further way to account for the dose sensitivity variation versus dose is through a dose mapping correction, i.e., correction of dose in the discrete areas in the beam of a radiation through, e.g., a controllable element in the projection optics. For example, in a dose mapping correction, the dose may be locally changed to account for an external factor in the lithographic apparatus (e.g., the impact on the beam due to a change in refractive index of an optical element caused by heating). Thus, in making the correction, the local dose-sensitivity may be factored in the change to the dose. Similarly, the dose may be locally changed to actively change the dose sensitivity (i.e., making the change without compensation for an external factor).

In considering dose sensitivity versus dose, the particular position(s) on a feature, the position of another part of the feature relative to that position on the feature, and/or the position of another feature relative to that position on the feature may be considered in the optimization and/or tuning processes. For example, the sidewall of the waist of a "brick" or trench and of the end of the "brick" or trench may be different. So, sidewall change and/or local dose sensitivity through dose may be different for the waist and end. Thus, the ratio of dose sensitivity between the waist and the end may change through dose. As a result of this, it may be difficult to control the shape of the "brick" or trench. A lowest dose sensitivity for both waist and end, as well as the ratio of the dose sensitivities, may be observed at a particular dose. So, this would be in many cases the preferred set-point for dose; both CD and aspect ratio of the trench may be best controlled. However, going to a dose of different dose, there may be a high dose sensitivity ratio between the waist and end. This may an optimum condition for tuning the "brick" or trench aspect ratio; for example, a small dose change may influence the end much more than the waist.

Throughout this description, dose sensitivity versus dose has been discussed. In an embodiment, the references to dose sensitivity versus dose herein may be interchanged, as appropriate, with SWA versus dose.

Figure 11:
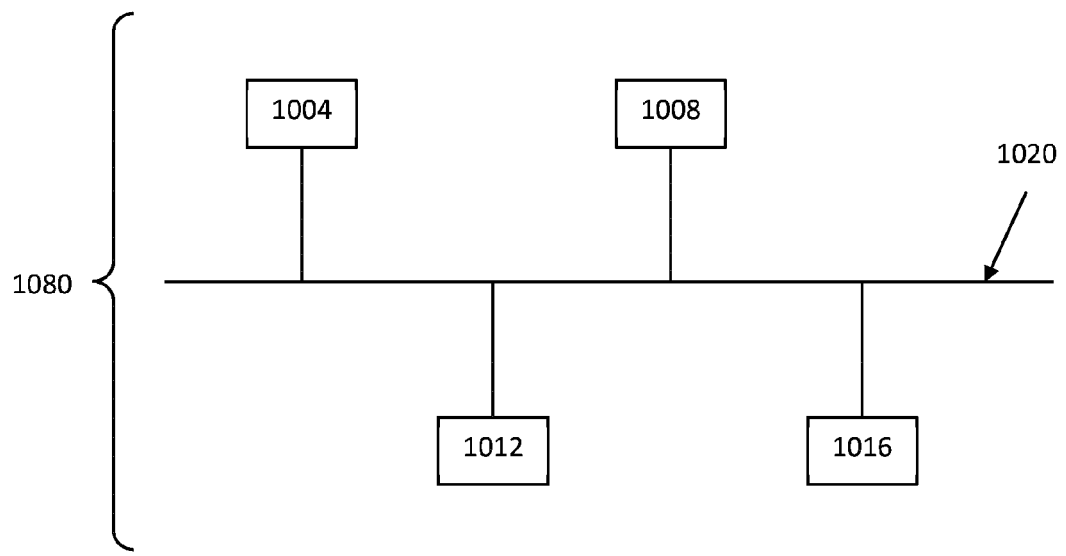
FIG. 11 shows a block diagram of a computer.

As shown in FIG. 11, a computer 1080 may comprise a general purpose computer programmed with one or more software applications that enable the various features and functions of the disclosure, as described in greater detail below. In one exemplary implementation, computer 1080 may comprise a personal computer. Computer 1080 may comprise a portable (e.g., laptop) computer, a cell phone, smart phone, PDA, pocket PC, or other device.

Computer 1080 may comprise one or more processors 1004, one or more interfaces 1008 (to one or more various peripheral devices or components), memory 1012, one or more storage devices 1016, and/or other components coupled via a bus 1020. Memory 1012 may comprise random access memory (RAM), read only memory (ROM), or other memory. Memory 1012 may store computer-executable instructions to be executed by one or more processors 1004 as well as data which may be manipulated by the one or more processors 1004. Storage device 1016 may comprise a hard disk, an optical disk, tape storage, or other storage device for storing computer-executable instructions and/or data. One or more software applications may be loaded into memory 1012 and run on an operating system of computer 1080. In some implementations, an application program interface (API) may be provided to, for example, enable third-party developers to create complimentary applications, and/or to enable content exchange.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Although specific reference may have been made above to the use of embodiments of the disclosure in the context of optical lithography, it will be appreciated that the disclosure may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

The lithographic apparatus may also be of a type wherein a surface of the substrate is immersed in a liquid having a relatively high refractive index, e.g. water, so as to fill a space between a final element of the projection system and the substrate. Immersion liquids may also be applied to other spaces in the lithographic apparatus, for example, between the patterning device and a first element of the projection system. Immersion techniques are well known in the art for increasing the numerical aperture of projection systems.

The terms "radiation" and "beam" used herein encompass all types of electromagnetic radiation, including ultraviolet (UV) radiation (e.g. having a wavelength of or about 365, 248, 193, 157 or 126 nm) and extreme ultra-violet (EUV) radiation (e.g. having a wavelength in the range of 5-20 nm), as well as particle beams, such as ion beams or electron beams.

The term "lens", where the context allows, may refer to any one or combination of various types of optical components, including refractive, reflective, magnetic, electromagnetic and electrostatic optical components.

While specific embodiments of the disclosure have been described above, it will be appreciated that the disclosure may be practiced otherwise than as described. For example, the disclosure may take the form of a computer program containing one or more sequences of machine-readable instructions configured to cause performance of a method as disclosed above, or a computer-readable data storage medium (e.g. semiconductor memory, magnetic or optical disk) having such a computer program stored therein.

The invention may further be described using the following clauses:

1. A method for lithography using a lithographic apparatus configured to transfer a pattern from a patterning device onto a substrate, the method comprising determining values of, or a function describing, dose sensitivity of at least part of the pattern at a plurality of values of dose, wherein the dose sensitivity is not a monotonically increasing or monotonically decreasing function of the dose.
2. The method of clause 1, wherein the dose sensitivity is a derivative of a parameter of a feature in a resist image of the pattern on the substrate with respect to the dose.
3. The method of clause 2, wherein the parameter is a critical dimension measured at a certain depth in a resist layer on the substrate.
4. The method of clause 2, wherein the parameter is a sidewall angle of the feature.
5. The method of clause 1, wherein the dose sensitivity is a derivative of a parameter of a feature in an aerial image of the pattern with respect to the dose.
6. The method of clause 1, wherein the dose is a function of a position in a resist image of the pattern on the substrate.
7. The method of any of clauses 1 to 6, further comprising calculating a dimension of a feature in a resist image of the pattern on the substrate using the dose sensitivity.
8. The method of clause 7, wherein calculating the dimension of the feature comprises calculating the dimension using one or more parameters selected from: a parameter of a radiation source of the lithographic apparatus, a parameter of projection optics of the lithographic apparatus, a parameter of an illumination source of the lithographic apparatus, a resist parameter, a development parameter, and/or an etching parameter.
9. The method of any of clauses 1 to 8, further comprising optimizing or adjusting a design variable, wherein the dose sensitivity is a function of the design variable.
10. A method comprising calculating a parameter of a lithographic process to transfer a pattern from a patterning device onto a substrate based on values of, or a function describing, a dose sensitivity of at least part of the pattern at a plurality of values of dose, wherein the dose sensitivity is not a monotonically increasing or monotonically decreasing function of the dose.
11. The method of clause 10, wherein the parameter is selected from: a parameter of a radiation source of the lithographic apparatus, a parameter of projection optics of the lithographic apparatus, a parameter of the pattern on the patterning device, a parameter of an illumination source of the lithographic apparatus, a resist parameter, a development parameter, and/or an etching parameter.
12. The method of clause 10 or clause 11, comprising simulating an aerial image or a resist image using the values of, or the function describing, the dose sensitivity.
13. The method of any of clauses 10 to 12, further comprising calculating a cost function that is a function of one or more design variables, the one or more design variables including dose.
14. A non-transitory computer program product comprising a computer readable medium having instructions recorded thereon, the instructions when executed by a computer implementing the method of any of the preceding clauses.
15. A computer product comprising a processor, a memory and a storage device, wherein the storage device at least stores values of, or a function describing, a dose sensitivity of at least part of a lithographic pattern at a plurality of values of dose, wherein the dose sensitivity is not a monotonically increasing or monotonically decreasing function of the dose.
16. The computer product of clause 15, further configured to calculate a dimension of a feature in a resist image of the lithographic pattern using the values of, or the function describing, the dose sensitivity.
17. The computer product of clause 15 or clause 16, further configured to calculate a cost function that is a function of one or more design variables, the one or more design variables including dose.
18. The computer product of any of clauses 15 to 17, configured to simulate an aerial image or a resist image using the values of, or the function describing, the dose sensitivity.
19. The method of clause 1, wherein the dose sensitivity is a derivative of a parameter of a feature in an aerial image of the pattern as function of a threshold in the aerial image.
20. The method of clause 9, wherein the design variable is selected from a group consisting of moving standard deviation in the z direction (MSDz), a coherence setting, post-exposure bake temperature, post-exposure bake time, resist formulation, a controllable element in projection optics, shape and location of a pattern on the patterning device, bias of a pattern on the patterning device, a parameter of a developer, and a combination thereof.
21. The method of clause 1, wherein the values of, or the function describing, dose sensitivity of at least part of the pattern at a plurality of values of dose are determined by a metrology technique.

The descriptions above are intended to be illustrative, not limiting. Thus, it will be apparent to those skilled in the art that modifications may be made to the disclosure as described without departing from the scope of the claims set out below.

What is claimed is:

1. A method for lithography using a lithographic apparatus configured to transfer a pattern from a patterning device onto a substrate, the method comprising determining, by a computer comprising a memory, values of, or a function describing, dose sensitivity of at least part of the pattern at a plurality of values of dose, wherein the dose sensitivity is not a constant, nor monotonically increasing nor monotonically decreasing function of the dose around nominal dose.

2. The method of claim 1, wherein the dose sensitivity is a derivative of a parameter of a feature in a resist image of the pattern on the substrate with respect to the dose.

3. The method of claim 2, wherein the parameter is selected from a list comprising a critical dimension measured at a certain depth in a resist layer on the substrate and a sidewall angle of the feature.

4. The method of claim 1, wherein the dose sensitivity is a derivative of a parameter of a feature in an aerial image of the pattern with respect to the dose.

5. The method of claim 1, wherein the dose sensitivities at a particular dose vary with respect to depth of the pattern in a resist layer.

6. The method of claim 1, further comprising calculating a dimension of a feature in a resist image of the pattern on the substrate using the dose sensitivity.

7. The method of claim 6, wherein calculating the dimension of the feature comprises calculating the dimension using one or more parameters selected from: a parameter of a radiation source of the lithographic apparatus, a parameter of projection optics of the lithographic apparatus, a parameter of an illumination source of the lithographic apparatus, a resist parameter, a development parameter, and/or an etching parameter.

8. The method of claim 1, further comprising optimizing or adjusting, based on the dose sensitivity or a value derived therefrom, a design variable, wherein the dose sensitivity is a function of the design variable.

9. The method of claim 8, wherein the design variable is selected from a group consisting of moving standard deviation in the z direction (MSDz), a coherence setting, post-exposure bake temperature, post-exposure bake time, resist formulation, a controllable element in projection optics, shape and location of a pattern on the patterning device, bias of a pattern on the patterning device, a parameter of a developer, and a combination thereof.

10. The method of claim 1, wherein the values of, or the function describing, dose sensitivity of at least part of the pattern at a plurality of values of dose are determined by a metrology technique.

11. A method comprising determining, by a computer comprising a memory, a parameter of a lithographic process to transfer a pattern from a patterning device onto a substrate based on values of, or a function describing, a dose sensitivity of at least part of the pattern at a plurality of values of dose, wherein the dose sensitivity is not a constant, nor monotonically increasing nor monotonically decreasing function of the dose.

12. The method of claim 11, wherein the parameter is selected from: a parameter of a radiation source of the lithographic apparatus, a parameter of projection optics of the lithographic apparatus, a parameter of the pattern on the patterning device, a parameter of an illumination source of the lithographic apparatus, a resist parameter, a development parameter, and/or an etching parameter.

13. The method of claim 11, comprising simulating an aerial image or a resist image using the values of, or the function describing, the dose sensitivity.

14. The method of claim 11, further comprising calculating a cost function that is a function of one or more design variables, the one or more design variables including dose.

15. A computer product comprising a processor, a memory and a storage device, wherein:
the storage device at least stores values of, or a function describing, a dose sensitivity of at least part of a lithographic pattern at a plurality of values of dose, wherein the dose sensitivity is not a constant, nor monotonically increasing nor monotonically decreasing function of the dose around nominal dose; and
(i) the memory and/or storage device comprises instructions configured to cause the processor to calculate a dimension of a feature in a resist image of the pattern on the substrate using the dose sensitivity, or (ii) the memory and/or storage device comprises instructions configured to cause the processor to optimize or adjust, based on the dose sensitivity or a value derived therefrom, a design variable, wherein the dose sensitivity is a function of the design variable, or (iii) both (i) and (ii).

16. The computer product of claim 15, wherein the dose sensitivity is a derivative of a parameter of a feature in a resist image of the pattern on the substrate with respect to the dose.

17. The computer product of claim 15, wherein the dose sensitivity is a derivative of a parameter of a feature in an aerial image of the pattern with respect to the dose.

18. The computer product of claim 15, wherein the dose sensitivities at a particular dose vary with respect to depth of the pattern in a resist layer.

19. The computer product of claim 15, wherein the memory and/or storage device comprises the instructions configured to cause the processor to calculate a dimension of a feature in a resist image of the pattern on the substrate using the dose sensitivity.

20. The computer product of claim 15, wherein the memory and/or storage device comprises the instructions configured to cause the processor to optimize or adjust, based on the dose sensitivity or a value derived therefrom, a design variable, wherein the dose sensitivity is a function of the design variable.

* * * * *